(12) United States Patent
Fukuda et al.

(10) Patent No.: US 8,710,653 B2
(45) Date of Patent: Apr. 29, 2014

(54) CHIP ON CHIP SEMICONDUCTOR DEVICE INCLUDING AN UNDERFILL LAYER HAVING A RESIN CONTAINING AN AMINE-BASED CURING AGENT

(75) Inventors: Masatoshi Fukuda, Yokohama (JP); Hiroshi Watabe, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/397,098

(22) Filed: Feb. 15, 2012

(65) Prior Publication Data

US 2012/0228762 A1    Sep. 13, 2012

(30) Foreign Application Priority Data

Mar. 11, 2011  (JP) .................................. 2011-054534

(51) Int. Cl.
*H01L 23/498* (2006.01)
*H01L 21/50* (2006.01)

(52) U.S. Cl.
USPC ............ 257/737; 257/E23.068; 257/E21.499; 257/738; 257/778; 257/685; 257/686; 257/723; 257/777; 257/724; 257/784; 257/786; 257/788; 257/789; 257/792; 257/780

(58) Field of Classification Search
USPC .......... 257/737, E23.068, E21.499, 738, 778, 257/685, 686, 723, 777, 724, 84, 786, 788, 257/789, 780, 790
See application file for complete search history.

(56) References Cited

U.S. PATENT DOCUMENTS

| | | | |
|---|---|---|---|
| 7,279,359 B2 * | 10/2007 | Chen et al. ..................... | 438/108 |
| 2003/0190479 A1 * | 10/2003 | Konarski ....................... | 428/413 |
| 2006/0060987 A1 * | 3/2006 | Chen et al. .................... | 257/787 |
| 2008/0122088 A1 * | 5/2008 | Todd et al. ..................... | 257/741 |
| 2010/0078830 A1 | 4/2010 | Katsurayama et al. | |
| 2010/0102446 A1 | 4/2010 | Katsurayama et al. | |
| 2010/0218853 A1 * | 9/2010 | Akamatsu et al. .............. | 148/23 |
| 2010/0244279 A1 * | 9/2010 | Hoshiyama et al. .......... | 257/778 |
| 2010/0264539 A1 * | 10/2010 | Miura ........................... | 257/738 |
| 2010/0304536 A1 * | 12/2010 | Sumita .......................... | 438/127 |
| 2011/0074018 A1 | 3/2011 | Fukuda | |
| 2011/0316162 A1 * | 12/2011 | Ko et al. ........................ | 257/773 |
| 2012/0001324 A1 | 1/2012 | Aoki et al. | |

FOREIGN PATENT DOCUMENTS

| | | | |
|---|---|---|---|
| CA | 2 667 852 A1 | 5/2008 | |
| CA | 2 667 853 A1 | 5/2008 | |
| EP | 2 079 108 A1 | 7/2009 | |
| EP | 2 096 671 A1 | 9/2009 | |

(Continued)

OTHER PUBLICATIONS

Office Action mailed Jun. 25, 2013 in Japanese Application No. 2011-054534 filed Mar. 11, 2011 (w/English translation).

*Primary Examiner* — Alexander Oscar Williams
(74) *Attorney, Agent, or Firm* — Oblon, Spivak, McClelland, Maier & Neustadt, L.L.P.

(57) ABSTRACT

A semiconductor device, includes: a wiring substrate, a stacked body mounted on the wiring substrate, an underfill layer filled into gaps between respective semiconductor chips of the stacked body; and a molding body made up of a molding resin covered and formed at outside of the stacked body and so on. The underfill layer is made up of a cured product of a resin material containing an amine-based curing agent, and the cured product has a Tg of 65° C. or more and 100° C. or less.

16 Claims, 1 Drawing Sheet

(56) References Cited

FOREIGN PATENT DOCUMENTS

| JP | 2003-297873 | 10/2003 |
| JP | 2011-029392 | 2/2011 |
| JP | 2011-77398 | 4/2011 |
| JP | 2012-15398 | 1/2012 |
| WO | WO 2008/054011 A1 | 5/2008 |

\* cited by examiner

CHIP ON CHIP SEMICONDUCTOR DEVICE INCLUDING AN UNDERFILL LAYER HAVING A RESIN CONTAINING AN AMINE-BASED CURING AGENT

CROSS-REFERENCE TO RELATED APPLICATION

This application is based upon and claims the benefit of priority from Japanese Patent Application No. 2011-054534, filed on Mar. 11, 2011; the entire contents of which are incorporated herein by reference.

FIELD

Embodiments described herein relate generally to a semiconductor device and a method for manufacturing a semiconductor device.

BACKGROUND

In recent years, development of high density packaging technology of a semiconductor integrated circuit has been promoted in accordance with requirements for high function and small-sizing of electronic apparatuses. There is a chip-on-chip type system in package in which another semiconductor chip is face-down mounted on a semiconductor chip as one of the packaging technology as stated above. The chip-on-chip structure as stated above is focused because it is effective for small-sizing, high-speed of operation, and power saving of the semiconductor package.

In the chip-on-chip type structure, a connection between the semiconductor chips is normally enabled by a flip-chip method via minute bumps. Besides, an underfill layer is formed by injecting a resin material between the semiconductor chips to protect a connection part from peripheral environment such as humidity and to secure mechanical strength.

However, in the conventional chip-on-chip type semiconductor device, peeling is easy to occur between a side surface of the semiconductor chip at an upper step and an underfill resin constituting the underfill layer when a temperature cycle of low-temperature and high-temperature is repeated. There is a case when a failure such that an internal wiring of the semiconductor chip at a lower step is cut because the peeling propagates inside the underfill resin as a crack.

DETAILED DESCRIPTION

According to one embodiment, a semiconductor device includes: a wiring substrate having a wiring layer at least at one principle surface; a stacked body mounted at the principle surface of the wiring substrate, in which two or more semiconductor chips are stacked and disposed with a predetermined interval and respective semiconductor chips are electrically connected with each other via bumps; an underfill layer made up of a resin filled into gaps between the respective semiconductor chips of the stacked body; and a molding body made up of a molding resin covered and formed at outside of the stacked body is provided. In the semiconductor device as stated above, the underfill layer is made up of a cured product of a resin material containing an amine-based curing agent, and a glass transition temperature (Tg) of the cured product is 65° C. or more and 100° C. or less.

Besides, according to one embodiment, a manufacturing method of a semiconductor device includes: preparing a wiring substrate having a wiring layer at least at one principle surface; mounting two or more semiconductor chips on the principle surface of the wiring substrate so that the semiconductor chips are stacked with a predetermined interval and respective semiconductor chips are electrically connected with each other via bumps; injecting and filling a thermosetting resin material into gaps between the respective semiconductor chips of the stacked body; forming an underfill layer made up of an underfill resin at the gaps by thermosetting the thermosetting resin material; and forming a molding body made up of a molding resin to cover an outside of the stacked body is provided. In the manufacturing method of the semiconductor device as stated above, the underfill resin contains an amine-based curing agent and has a glass transition temperature (Tg) of 65° C. or more and 100° C. or less.

First Embodiment

Figure 1:
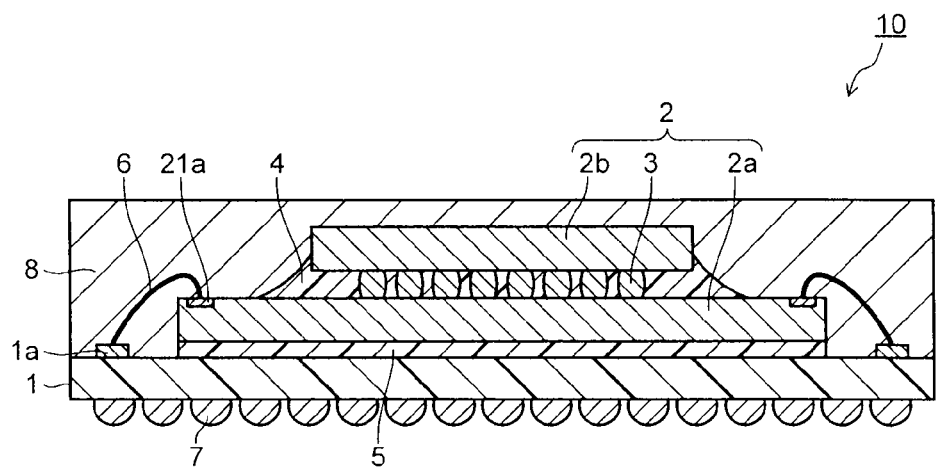
FIG. 1 is a sectional view illustrating a semiconductor device according to a first embodiment.

FIG. 1 is a sectional view illustrating a semiconductor device according to a first embodiment. A semiconductor device 10 illustrated in FIG. 1 includes a substrate 1 having a wiring circuit (not-illustrated) at a front surface (an upper surface in FIG. 1) being one principal surface, and a stacked body 2 mounted on the front surface of the wiring substrate 1 and electrically connected thereto. The semiconductor device 10 has an FBGA (Fine pitch Ball Grid Array) package mode.

The stacked body 2 has a structure in which a first semiconductor chip 2a is disposed in a face-up manner, and a second semiconductor chip 2b of which area of a principal plane is smaller than that of the first semiconductor chip 2a is disposed on the first semiconductor chip 2a such that respective circuit surfaces (element circuit surfaces) face, and they are connected via bumps 3. Thicknesses of the first and second semiconductor chips 2a, 2b are both 350 µm or less.

The bump 3 is constituted by metal materials such as Sn based solders, for example Sn—Ag solders (melting point: 221° C.) and Sn—Cu solders (melting point: 227° C.), or Au, Sn (melting point: 232° C.), Cu, Ni, Ag, Pd and so on. A bump diameter is 5 µm to 50 µm, and a pitch of an array is 10 µm to 100 µm. A thermocompression bonding, a reflow and so on are used for the connection of the first and second semiconductor chips 2a, 2b and the bumps 3.

A gap between the first semiconductor chip 2a and the second semiconductor chip 2b is preferable to be 5 µm to 50 µm, and more preferable to be 20 µm to 30 µm in the stacked body 2. A thermosetting resin material is filled and cured at the gap between the first semiconductor chip 2a and the second semiconductor chip 2b to form an underfill layer 4 made up of an underfill resin. Here, the underfill resin constituting the underfill layer 4 is made up of a cured product of an epoxy-based resin containing an amine-based curing agent. The preferable Tg of the underfill resin is 65° C. or more and 100° C. or less. The more preferable Tg of the underfill resin is 65° C. or more and 95° C. or less, and a preferable Tg is 65° C. or more and 90° C. or less.

When the underfill layer 4 is formed by using a resin material in which, for example, an acid anhydride based compound other than the amine-base is compounded as the curing agent, it is impossible to suppress the peeling of the underfill resin at the side surface of the semiconductor chip at a temperature cycle applying time. Besides, it is also impossible to suppress the peeling of the underfill resin at the temperature cycle applying time when the Tg of the underfill resin exceeds 100° C. Note that the lower the Tg of the cured product is, the more effective it works from a point of view of the suppression of the peeling of the underfill resin.

A measurement of the Tg of the underfill resin can be performed by a TMA (Thermal Mechanical Analysis). The TMA is a method in which aperiodic loads such as compression, tension, bending are added while changing a temperature of a sample by a certain program, and a deformation of a substance is measured as a function of the temperature or time. When deformations such as thermal expansion, softening, of the sample occur with correspond to the temperature change, a displacement amount according to the deformation is measured by a displacement detector as a position change amount of a probe. The Tg described in the embodiment is measured by the TMA method. Note that the measurement of the Tg is able to be performed by a DMA (Dynamic Mechanical Analysis).

An inorganic filler such as a silica powder is contained in the underfill resin so as to approximate a thermal expansion coefficient thereof to that of a silicon chip. In the embodiment, the inorganic filler contained in the underfill resin is preferable to be the one in which an average particle size is less than 0.5 µm and in which a maximum particle size is 3.0 µm or less. The average particle size of the inorganic filler is more preferable to be less than 0.4 µm, and further preferable to be less than 0.3 µm. Note that the average particle size is measured by a laser diffraction scattering method.

When the average particle size of the inorganic filler contained in the underfill resin is 0.5 µm or more, a flow of the resin material to form the underfill resin is prevented by the inorganic filler. Accordingly, it is difficult to fill the underfill resin material into a narrow gap (5 µm to 50 µm) between the semiconductor chips 2a, 2b in the chip-on-chip type semiconductor device according to the embodiment. Accordingly, it is difficult to form the underfill layer 4 without any void or segregation, and with a uniform composition. Note that a material before cured to form the underfill resin is called as an underfill resin material.

The underfill layer is also provided at a flip chip BGA (hereinafter, referred to as an FC-BGA) mounting a chip on a substrate without being limited to the chip-on-chip type semiconductor device. The epoxy-based resin containing the amine-based curing agent and in which the Tg of the cured product is 100° C. or less is used as a resin constituting the underfill layer of the FC-BGA as stated above. However, the resin used for the FC-BGA (hereinafter, referred to as the FC-BGA resin) contains the inorganic filler (for example, the silica powder) in which the particle size is larger (the average particle size is 0.5 µm or more, the maximum particle size is 3 µm or more) compared to the underfill resin used in the embodiment. The fluidity of the FC-BGA resin before cured is therefore worse compared to the underfill resin used in the embodiment. Accordingly, the material to form the conventional FC-BGA resin is able to be filled in a comparatively wide gap (50 µm to 70 µm) between the substrate and the semiconductor chip, but it is difficult to be filled into the narrow gap (5 µm to 50 µm) between the semiconductor chips 2a, 2b at the semiconductor device 10 according to the embodiment, and an unfilled state occurs. Note that the material before cured to form the FC-BGA resin is represented as an FC-BGA resin material.

Results examining fluidities of the underfill resin material used for the embodiment and the conventional FC-BGA resin material are described in the following. Note that the underfill resin material of the embodiment contains the silica powder in which the average particle size is 0.3 µm and in which the maximum particle size is 3.0 µm with a ratio of 50 mass %, and it is the resin material to form a later-described underfill resin G. Besides, an epoxy-based resin material in which the amine-based curing agent is contained, the silica powder in which the average particle size is 0.6 µm and in which the maximum particle size is 3.0 µm is contained with a ratio of 50 mass %, and the Tg of the cured product is 100° C. is used as the FC-BGA resin material.

(Comparative Experiment of Fluidity)

Two pieces of glass plates are fixed to have a gap of 20 µm, and the underfill resin material according to the embodiment and the conventional FC-BGA resin material are each penetrated into the gap. Then, times required for penetration for a predetermined distance (20 mm) are measured. Note that the glass plate is heated to 110° C.

As a result of the measurement, the filling times of the underfill resin material according to the embodiment and the FC-BGA resin material are the same as both 300 seconds. However, in the FC-BGA resin material, a flow mark is observed after the penetration. The flow mark means that a part which becomes nonuniform caused by segregation or the like of the filler or the other components in the resin is looked like streaks, and it is generated when the fluidity of the resin is not good. If the flow mark is generated, it is not preferable because a tip form of the flow gets out of order, and a void is easy to occur because air is mixed up at the penetration time. It is verified by the experiment that the fluidity of the resin material to form the underfill resin according to the embodiment is better than the FC-BGA resin material.

In the semiconductor device 10 according to the first embodiment, the stacked body 2 is mounted on the wiring substrate 1 as described below and it is electrically connected thereto. A lower surface of the first semiconductor chip 2a at a lower step side of the stacked body 2 is fixed on the wiring substrate 1 by a die attach material 5. The above-described structure can be formed by a method which includes forming the stacked body 2 and mounting the stacked body 2 on the wiring substrate 1. The structure can be formed by another method, including a first step of disposing a first semiconductor chip 2a on the wiring substrate 1 and a second step of disposing a second semiconductor chip 2b on the first semiconductor chip 2a and connecting them via bumps 3. Connection pads 21a disposed at a peripheral part of an upper surface (element circuit surface) of the first semiconductor chip 2a and connection terminals 1a of the wiring substrate 1 are connected via bonding wires 6 being Au wires and so on. External connection terminals 7 made of solder balls and so on are provided at a rear surface of the wiring substrate 1.

A molding body 8 made up of a molding resin is formed to cover the stacked body 2, and at outside of the connection part between the stacked body 2 and the wiring substrate 1. A side edge surface of the molding body 8 is formed vertically relative to a principal surface of the wiring substrate 1.

The epoxy-based resin is used as the molding resin constituting the molding body 8. It is preferable that the molding resin in which the physical property values are within a range described below is used. Note that these physical property values are values obtained by the above-stated measurement of the TMA.

Tg: 130° C. to 200° C.

Thermal expansion coefficient at the temperature less than the Tg (CTE1): 0.8 ppm/° C. to 1.4 ppm/° C.

Thermal expansion coefficient at the temperature of the Tg or more (CTE2): 3.0 ppm/° C. to 4.9 ppm/° C.

Bending elasticity modulus: 15 GPa to 30 GPa

When the molding resin having the above-stated physical property values is used, a relaxation effect of a thermal stress owing to the molding body 8 is high, and in particular, there is an outstanding effect reducing a warpage of a whole of the package.

In the first embodiment, the underfill layer 4 is constituted by the underfill resin being the cured product of the resin material containing the amine-based curing agent and in which the Tg is 65° C. or more and 100° C. or less, and therefore, it is possible to suppress the peeling of the underfill resin at the side surface of the second semiconductor chip 2b at the temperature cycle applying time, and to prevent a disconnection failure such as the cutting of the internal wiring of the first semiconductor chip 2a.

In general, it is conceivable that the peeling of the underfill resin at the temperature cycle applying time is caused by a peel stress acts between the side surface of the second semiconductor chip 2b and the underfill resin. It is effective to reduce the peel stress when the Tg of the underfill resin is decreased to be 100° C. or less. Besides, there is an effect to increase an adhesive strength of the underfill resin to the side surface of the semiconductor chip by containing the amine-based curing agent in the underfill resin. In the embodiment, it is possible to prevent the peeling of the underfill resin by combining these two effects.

Note that it is possible to laminate still another semiconductor chip (a memory chip and so on) on the stacked body 2 in the first embodiment illustrated in FIG. 1. Namely, a mode can be taken in which a third semiconductor chip is stacked on the second semiconductor chip 2b of the stacked body 2 in a faced up manner (the active surface is at the upper side), fixed by the die attach material and so on, and further connected by bonding wires.

Next, concrete examples of the first embodiment as stated above are described.

Examples 1 to 11

Comparative Examples 1 to 6

(Underfill Resins A to L)

At first, the inorganic fillers (silica powder) with the particles sizes (the average particle size and the maximum particle size) represented in Table 1 are each mixed into the epoxy-based resin to be a compounding ratios (mass %) represented in the same table, the curing agents represented in Table 1 are further added and mixed to prepare underfill resin materials AA to LL.

The Tg, the thermal expansion coefficients (CTE1, CTE2), and a bending elasticity modulus (25° C.) are measured by the TMA as for each of the underfill resins A to L being the cured products of the underfill resin materials AA to LL obtained as stated above. These measurement results are respectively illustrated in Table 1. Note that a thermomechanical analysis apparatus manufactured by MAC SCIENCE Corporation is used for the TMA measurement.

TABLE 1

| | | UNDERFILL RESIN | | | | | | | | | | |
|---|---|---|---|---|---|---|---|---|---|---|---|---|
| | | A | B | C | D | E | F | G | H | I | J | K | L |
| FILLER | COMPOUND AMOUNT (MASS %) | 50 | 50 | 45 | 45 | 40 | 35 | 50 | 45 | 40 | 40 | 50 | 50 |
| | AVERAGE PARTICLE SIZE (μm) | 0.3 | 0.3 | 0.3 | 0.3 | 0.3 | 0.3 | 0.3 | 0.3 | 0.3 | 0.3 | 0.3 | 0.3 |
| | MAXIMUM PARTICLE SIZE (μm) | 1 | 3 | 3 | 1 | 3 | 3 | 3 | 3 | 3 | 3 | 3 | 3 |
| CURING AGENT (BASE) | | ACID ANHYDRIDE | AMINE | AMINE | AMINE | AMINE | AMINE | AMINE | AMINE | AMINE | AMINE | AMINE | AMINE |
| PHYSICAL PROPERTY VALUES | Tg (° C.) (TMA METHOD) | 135 | 68 | 83 | 84 | 85 | 85 | 86 | 95 | 100 | 104 | 111 | 127 |
| | CTE 1 (ppm/° C.) | 42 | 39 | 43 | 43 | 48 | 50 | 39 | 43 | 45 | 45 | 36 | 36 |
| | CTE 2 (ppm/° C.) | 125 | 128 | 128 | 127 | 137 | 148 | 120 | 133 | 141 | 140 | 121 | 114 |
| | BENDING ELASTICITY MODULUS (25° C.) (GPa) | 7.0 | 9.4 | 7.9 | 8.1 | 7.0 | 4.7 | 8.6 | 7.1 | 5.9 | 5.8 | 7.9 | 6.1 |

(Manufacturing of Semiconductor Device)

Next, the resin materials AA to LL to form the underfill resins A to L represented in Table 1 are each filled into the gap between the first semiconductor chip 2a and the second semiconductor chip 2b, heat and cure the resin material to form each of the underfill layers made up of the underfill resins A to L. Besides, the molding body 8 is formed by using two kinds of molding resins "a" and "b", and the semiconductor device 10 illustrated in FIG. 1 is manufactured. The physical property values of the molding resins "a" and "b" are described below.

A size of the first semiconductor chip 2a is 7.5 mm×7.1 mm, a size of the second semiconductor chip 2b is 5.9 mm×5.2 mm, thicknesses thereof are both 150 μm. Besides, the bumps 3 connecting these semiconductor chips are the Sn—Cu solder bumps, each bump diameter is 30 μm, and a pitch is 60 μm. The physical property values of the molding resin "a" are as follows: the Tg is 130° C., the CTE1 is 0.8 ppm/° C., the CTE2 is 3.0 ppm/° C., and the bending elasticity modulus at 25° C. is 30 GPa. The physical property values of the molding resin "b" are as follows: the Tg is 200° C., the CTE1 is 1.4 ppm/° C., the CTE2 is 4.9 ppm/° C., and the bending elasticity modulus at 25° C. is 15 GPa. Note that the physical property values of the molding resin are the values measured by the TMA method by using the thermomechanical analysis apparatus manufactured by MAC SCIENCE Corporation as same as the underfill resin.

(Reliability Test)

Reliabilities of the semiconductor devices 10 obtained in the examples 1 to 11 and the comparative examples 1 to 6 are verified by a temperature cycling test (−55° C./125° C.). The temperature cycle of −55° C./125° C. is applied to these semiconductor devices 10 for 500 cycles, and thereafter, presence/absence of the peeling between the side surface of the second semiconductor chip 2b and the underfill resin are examined by performing a cross-sectional analysis. Results are represented in Table 2.

TABLE 2

|  | EXAMPLES | | | | | | | | | | | COMPARATIVE EXAMPLES | | | | | |
| --- | --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 1 | 2 | 3 | 4 | 5 | 6 |
| Underfill Resin | B | C | D | D | E | F | G | H | H | I | I | A | A | J | J | K | L |
| Molding Resin | a | a | a | b | a | a | a | a | b | a | b | a | b | a | b | a | a |
| Peeling After TCT | *A | *A | *A | *A | *A | *A | *A | *A | *A | *A | *A | *P | *P | *P | *P | *P | *P |

*A = Absent
*P = Present

In the examples 1 to 11, the underfill layers 4 made up of the underfill resins B to I are formed by using the underfill resin materials BB to II each containing the amine-based curing agent and in which the Tg of the cured products is 65° C. or more and 100° C. or less, and therefore, it is verified that the semiconductor devices 10 with high reliability and without having the peeling of the underfill layer 4 caused by the temperature cycling test (TCT) can be obtained from the results in Table 2.

Second Embodiment

Figure 2:
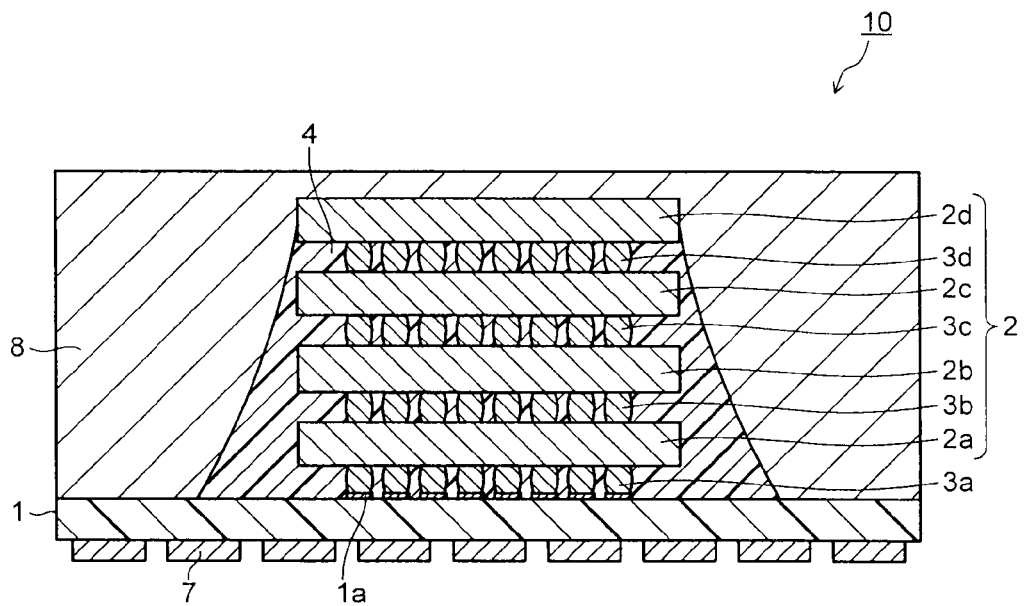
FIG. 2 is a sectional view illustrating a semiconductor device according to a second embodiment.

FIG. 2 is a sectional view illustrating a semiconductor device according to a second embodiment. A semiconductor device 10 according to the second embodiment illustrated in FIG. 2 includes a wiring substrate 1 having a wiring circuit at a front surface being one principle surface (an upper surface in FIG. 2), and external connection terminals 7 formed by gold plating and so on at a rear surface. A stacked body 2 in which four pieces from a first to a fourth semiconductor chips 2a, 2b, 2c, 2d are disposed with a predetermined interval with each other is mounted at the front surface of the wiring substrate 1. The first semiconductor chip 2a, the second semiconductor chip 2b, the third semiconductor chip 2c, and the fourth semiconductor chip 2d each have approximately the same principle surface area. Besides thicknesses thereof are each 50 μm or less.

Connection terminals 1a made up of gold plating layers are formed at the front surface of the wiring substrate 1, and the first semiconductor chip 2a being the semiconductor chip at a lowermost step is connected on the connection terminals 1a via a first bump connection part 3a. Besides, the second semiconductor chip 2b is disposed on the first semiconductor chip 2a, and the second semiconductor chip 2b and the first semiconductor chip 2a are connected via a second bump connection part 3b. The third semiconductor chip 2c is disposed on the second semiconductor chip 2b, and the second semiconductor chip 2b and the third semiconductor chip 2c are connected via a third bump connection part 3c, further, the fourth semiconductor chip 2d is disposed on the third semiconductor chip 2c, and these semiconductor chips are connected via a fourth bump connection part 3d. Gaps between the first to fourth semiconductor chips 2a, 2b, 2c, 2d are each 5 μm to 50 μm.

In the first bump connection part 3a, the solder bumps formed at a lower surface of the first semiconductor chip 2a are connected on the connection terminals 1a made up of gold plating layers formed at the front surface of the wiring substrate. In each of the second bump connection part 3b, the third bump connection part 3c, the fourth bump connection part 3d, the bumps of Sn based solders such as Sn—Ag solders (melting point: 221° C.) and Sn—Cu solders (melting point: 227° C.), or Sn are each formed at a lower step side, and bumps of Sn based solders such as Sn—Ag solders and Sn—Cu solders, or Sn, Au, Ag, Pd, Ni, Cu and so on are each formed at an upper step side of each semiconductor chip, and these bumps are bonded to be integrated. A bump diameter is 5 μm to 50 μm, and a pitch of an array is 10 μm to 100 μm.

Besides, vias (not-illustrated) penetrating from a front side to a rear side called as TSVs (Through Silicon Vias) are each provided at the first semiconductor chip 2a, the second semiconductor chip 2b, and the third semiconductor chip 2c, and the stacked first semiconductor chip 2a to the fourth semiconductor chip 2d are electrically connected with each other.

A thermosetting resin material is filled into a gap between the first semiconductor chip 2a and the wiring substrate 1, and gaps of respective semiconductor chips from the first semiconductor chip 2a to the fourth semiconductor chips 2d which are connected via the bumps, and underfill layers 4 are formed. The underfill layer 4 constituted by an underfill resin being a cured product of an epoxy-based resin containing an inorganic filler and the amine-based curing agent as same as the first embodiment. The Tg of the underfill resin is 65° C. or more and 100° C. or less. The preferable Tg of the underfill resin is 65° C. or more and 95° C. or less, and the more preferable Tg is 65° C. or more and 90° C. or less. The underfill resin is preferable to contain the silica powder in which the average particle size is less than 0.5 μm and in which the maximum particle size is 3.0 μm or less as the inorganic filler.

The filling of a resin material to form the underfill resin (underfill resin material) may be performed collectively into the gap between the wiring substrate 1 and the first semiconductor chip 2a, and the gaps between the respective semiconductor chips after the four pieces of semiconductor chips of the first semiconductor chip 2a to the fourth semiconductor chip 2d are all stacked and disposed. Besides, the semiconductor chips are stacked in sequence from the lower step side, and the underfill resin material may be filled into the formed gap in sequence.

The stacked body 2 is connected to the connection terminals 1a of the wiring substrate 1 via the first bump connection part 3a, and further connected to external connection terminals 7 formed at a rear surface through the wiring circuit of the wiring substrate 1.

A molding body 8 made up of a molding resin is formed to cover the stacked body 2, and an outside of the connection part between the stacked body 2 and the wiring substrate 1. A side edge surface of the molding body 8 is formed vertically relative to the principal surface of the wiring substrate 1. It is preferable to use the epoxy-based resin having physical property values as same as the first embodiment as the molding resin.

In the second embodiment constituted as stated above, it is possible to suppress peeling of the underfill resin at a side surface of the semiconductor chip at a temperature cycle applying time.

According to at least one of the embodiments described hereinabove, it is possible to suppress the peeling of the underfill resin at the side surface of the semiconductor chip at the upper step side at the temperature cycle applying time by constituting the underfill layer 4 with the cured product of the epoxy-based resin (in which the Tg is 65° C. or more and 100° C. or less) containing the amine-based curing agent in the chip-on-chip type semiconductor device, and it is possible to improve the reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and sprit of the inventions.

What is claimed is:

1. A semiconductor device, comprising:
   a wiring substrate having a wiring layer at least at one principle surface;
   a stacked body mounted at the principle surface of the wiring substrate, in which two or more semiconductor chips are stacked and disposed with a predetermined interval and respective semiconductor chips are electrically connected with each other via bumps;
   an underfill layer including a resin and filled into gaps between the respective semiconductor chips of the stacked body, the resin containing an amine-based curing agent, and the resin having a glass transition temperature (Tg) of 65° C. or more and 100° C. or less; and
   a molding body including a molding resin and covered and formed at outside of the stacked body.

2. The semiconductor device according to claim 1, wherein the stacked body includes a first semiconductor chip disposed in a face-up manner at the principle surface of the wiring substrate, and a second semiconductor chip disposed such that an element circuit surface faces thereto and of which an area of a principle surface is smaller than that of the first semiconductor chip.

3. The semiconductor device according to claim 1, wherein the resin is an epoxy-based resin.

4. The semiconductor device according to claim 1, wherein the underfill layer further includes an inorganic filler in which an average particle size is less than 0.5 μm.

5. The semiconductor device according to claim 4, wherein the inorganic filler is a silica powder.

6. The semiconductor device according to claim 1, wherein the bump is constituted by at least one kind of a metal material selected from Sn based solders such as Sn—Ag solders and Sn—Cu solders, Au, Sn, Cu, Ag, Pd and Ni.

7. The semiconductor device according to claim 1, wherein a diameter of the bump is 5 μm to 50 μm, and a pitch of an array of the bumps is 10 μm to 100 μm.

8. The semiconductor device according to claim 1, wherein a gap between respective semiconductor chips constituting the stacked body is 5 μm to 50 μm.

9. The semiconductor device according to claim 1, wherein thicknesses of the two or more semiconductor chips constituting the stacked body are each 350 μm or less.

10. The semiconductor device according to claim 1, wherein the molding resin has 130° C. to 200° C. of the Tg, 0.8 ppm/° C. to 1.4 ppm/° C. of a thermal expansion coefficient at a temperature of less than the Tg (CTE1), 3.0 ppm/° C. to 4.9 ppm/° C. of a thermal expansion coefficient at a temperature of the Tg or more (CTE2), and 15 GPa to 30 GPa of a bending elasticity modulus.

11. The semiconductor device according to claim 1, wherein the molding resin is an epoxy-based resin.

12. The semiconductor device according to claim 1, wherein a side edge surface of the molding body is vertically formed relative to the principle surface of the wiring substrate.

13. The semiconductor device according to claim 1, wherein the stacked body has a structure in which two or more semiconductor chips in which areas of principle surfaces are approximately identical are disposed with a predetermined interval with each other, and connected via the bumps.

14. The semiconductor device according to claim 13, wherein thicknesses of the two or more semiconductor chips constituting the stacked body are each 50 μm or less.

15. The semiconductor device according to claim 5, wherein the underfill layer includes 50 mass % or more of the silica powder.

16. The semiconductor device according to claim 2, wherein the wiring substrate has a connection terminal of gold, and the first semiconductor chip and the connection terminal is connected via a second bump.

* * * * *